(12) United States Patent
Suh

(10) Patent No.: US 9,437,843 B2
(45) Date of Patent: Sep. 6, 2016

(54) ORGANIC LIGHT EMITTING DIODE DISPLAY DEVICE AND METHOD OF MANUFACTURING THE SAME

(71) Applicant: SAMSUNG DISPLAY CO., LTD., Yongin, Gyeonggi-do (KR)

(72) Inventor: Min-Chul Suh, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 466 days.

(21) Appl. No.: 13/967,190

(22) Filed: Aug. 14, 2013

(65) Prior Publication Data

US 2013/0330868 A1 Dec. 12, 2013

Related U.S. Application Data

(62) Division of application No. 12/588,690, filed on Oct. 23, 2009, now abandoned.

(30) Foreign Application Priority Data

Oct. 23, 2008 (KR) ........................ 10-2008-0104427

(51) Int. Cl.
  *H01L 51/54* (2006.01)
  *H01L 51/56* (2006.01)
  *H01L 27/32* (2006.01)

(52) U.S. Cl.
  CPC ........... *H01L 51/56* (2013.01); *H01L 27/3246* (2013.01)

(58) Field of Classification Search
  None
  See application file for complete search history.

(56) References Cited

U.S. PATENT DOCUMENTS

| | | | |
|---|---|---|---|
| 2001/0031378 A1 | 10/2001 | Kreuder et al. | |
| 2004/0090176 A1 | 5/2004 | Han et al. | |
| 2005/0058785 A1* | 3/2005 | Uhlig | B41M 5/506 428/32.24 |
| 2005/0158579 A1 | 7/2005 | Marks et al. | |
| 2006/0060838 A1* | 3/2006 | Kang | H01L 27/3246 257/40 |
| 2007/0040169 A1* | 2/2007 | Kim | H01L 51/0004 257/40 |
| 2008/0078990 A1* | 4/2008 | Hahn | C08G 65/007 257/40 |

FOREIGN PATENT DOCUMENTS

| | | |
|---|---|---|
| JP | 2006-147910 A | 6/2006 |
| KR | 10-2005-0051072 A | 6/2005 |
| KR | 10-2007-0053060 A | 5/2007 |
| KR | 10-2007-0062859 A | 6/2007 |
| KR | 10-0822209 B1 | 4/2008 |
| KR | 10-2009-0090169 A | 8/2009 |

* cited by examiner

*Primary Examiner* — Andrew K Bohaty
(74) *Attorney, Agent, or Firm* — Robert E. Bushnell, Esq.

(57) ABSTRACT

The OLED display device includes a substrate, a first electrode located on the substrate, a pixel defining layer located on the first electrode to expose a part of the first electrode, a fluorine-based polymer layer located on the pixel defining layer, an organic layer located on the first electrode, and a second electrode located on the entire surface of the substrate. The method of manufacturing the OLED display device includes forming a first electrode on a substrate, forming a pixel defining layer on the first electrode, forming a fluorine-based polymer layer on the pixel defining layer, patterning the fluorine-based polymer layer and the pixel defining layer by laser ablation to open a part of the first electrode, forming an organic layer on the opened first electrode, and forming a second electrode on the entire surface of the substrate.

9 Claims, 5 Drawing Sheets

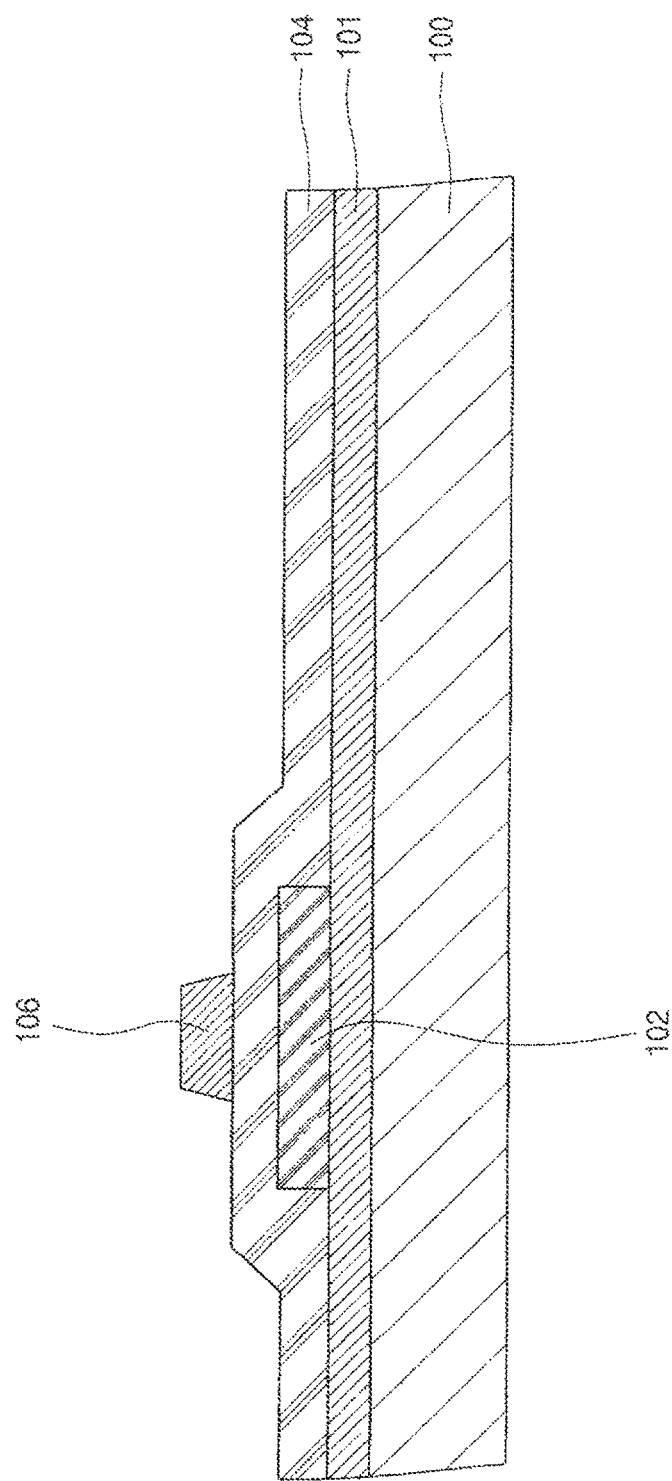

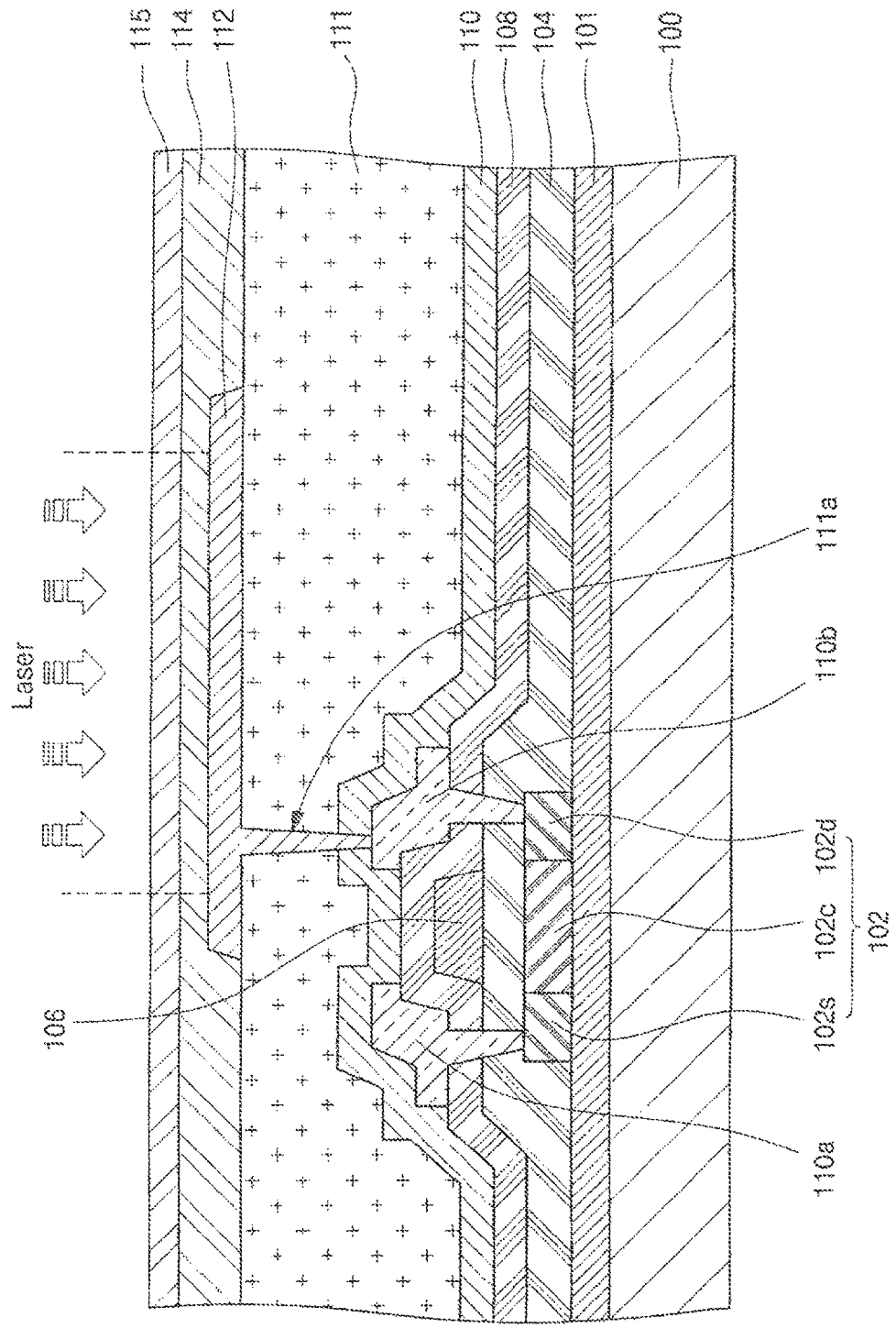

ORGANIC LIGHT EMITTING DIODE DISPLAY DEVICE AND METHOD OF MANUFACTURING THE SAME

CLAIM OF PRIORITY

This application claims the benefit under 35 USC §121 and 35 USC §120 of prior non-provisional application U.S. application Ser. No. 12/588,690, ORGANIC LIGHT EMITTING DIODE DISPLAY DEVICE AND METHOD OF MANUFACTURING THE SAME, filed 23 Oct. 2009, and incorporates by reference the same herein in its entirety, which application makes reference to, and incorporates by reference, and claims all benefits incurring under 35 USC §119 from an application for ORGANIC LIGHT EMITTING DIODE DISPLAY DEVICE AND METHOD OF MANUFACTURING THE SAME earlier filed in the Korean Intellectual Property Office on 23 Oct. 2008 and there duly assigned Serial No. 10-2008-0104427.

BACKGROUND OF THE INVENTION

1. Field of the Invention

Non-limiting example embodiments of the present invention relate to an organic light emitting diode (OLED) display device and methods of manufacturing the same, and more particularly, to OLED display devices in which an organic layer is formed after easily patterning a pixel defining layer formed of a photoresist material using a fluorine-based polymer layer to improve a surface property of a first electrode, and a method of manufacturing the same.

2. Description of the Related Art

Among flat panel display devices, an OLED display device has advantages such as a fast response time of 1 ms or less, low power consumption, self-emission and a wide viewing angle as a moving picture display medium regardless of its size. It may be also fabricated at a low temperature and in a simple process based on conventional semiconductor processing technology, and thus attracts attention as a next generation flat panel display device.

The OLED display device may be classified as a polymer device manufactured by using a wet process or a small molecule device manufactured by using deposition, depending on the material used for an organic light emitting diode and the process.

Among methods of patterning a polymer or small molecule emission layer, when an emission layer is pattered by ink-jet printing, materials for organic layers except for an emission layer are limited, and a structure for ink-jet printing should be formed on a substrate. When an emission layer is pattered by deposition, it is difficult to fabricate a large device due to use of a metal mask. An alternative technique for such a patterning technique is laser induced thermal imaging (LITI), which has developed in recent times.

However, there are some problems when an organic layer including an emission layer is formed by these methods. An organic light emitting diode includes many underlying polymer organic layers, which may be also formed in a non-emission region while these organic layers including an organic emission layer are formed on a first electrode, thereby affecting an underlying device. Thus, defects may be generated and production yield may be reduced.

SUMMARY OF THE INVENTION

Non-limiting example embodiments of the present invention provide organic light emitting diode (OLED) display devices. The organic light emitting diode display device may include a substrate, a first electrode, a pixel defining layer, a fluorine-based polymer layer, an organic layer and a second electrode. For example, the first electrode is located on the substrate. The pixel defining layer is located on the first electrode. The pixel defining layer has an opening. The fluorine-based polymer layer is located on the pixel defining layer. The fluorine-based polymer has an opening. The opening of the fluorine-based polymer layer interconnects to the opening of the pixel-defining layer to expose a part of the first electrode. The organic layer is located on the exposed part of the first electrode. The second electrode is located on the organic layer and the fluorine-based polymer layer.

Non-limiting example embodiments of the present invention provide OLED devices. The OLED devices include a substrate, a first electrode, a pixel, a fluorine-based polymer layer, an organic layer and a second electrode. For example, the first electrode is located on the substrate. The pixel defining layer is located on the first electrode. The pixel defining layer has an opening. The pixel defining layer is formed using a photoresist material. The fluorine-based polymer layer is located on the pixel defining layer. The fluorine-based polymer has an opening. The opening of the fluorine-based polymer layer interconnects to the opening of the pixel-defining layer to expose a part of the first electrode. The organic layer is located on the exposed part of the first electrode. The second electrode is located on the organic layer and the fluorine-based polymer layer. The fluorine-based polymer layer comprises at least one of the compounds represented by Formulae 1 to 3:

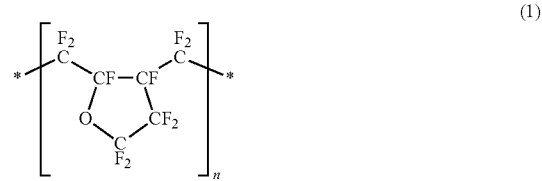

(1)

wherein n is an integer of about 50 to 1,000;

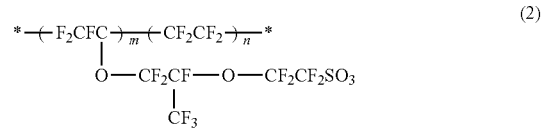

(2)

wherein m is an integer of about 50 to 1,000, and n is an integer of about 50 to 1,000; and

(3)

wherein n is an integer of about 50 to 1,000.

Non-limiting example embodiments of the present invention provide methods of manufacturing OLED devices. For example, a substrate is provided. A first electrode is formed on the substrate. A pixel defining layer is formed on the first electrode. A fluorine-based polymer layer is formed on the pixel defining layer. An opening is formed in the pixel defining layer and the fluorine-based polymer layer to expose a part of the first electrode. An organic layer is formed on the exposed part of the first electrode. A second electrode is formed on the organic layer and the fluorine-based polymer layer.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIGS. 1A to 1E are cross-sectional views illustrating an organic light emitting diode (OLED) display device according to non-limiting example embodiments of the present invention.

DETAILED DESCRIPTION OF THE INVENTION

Figure 1B:
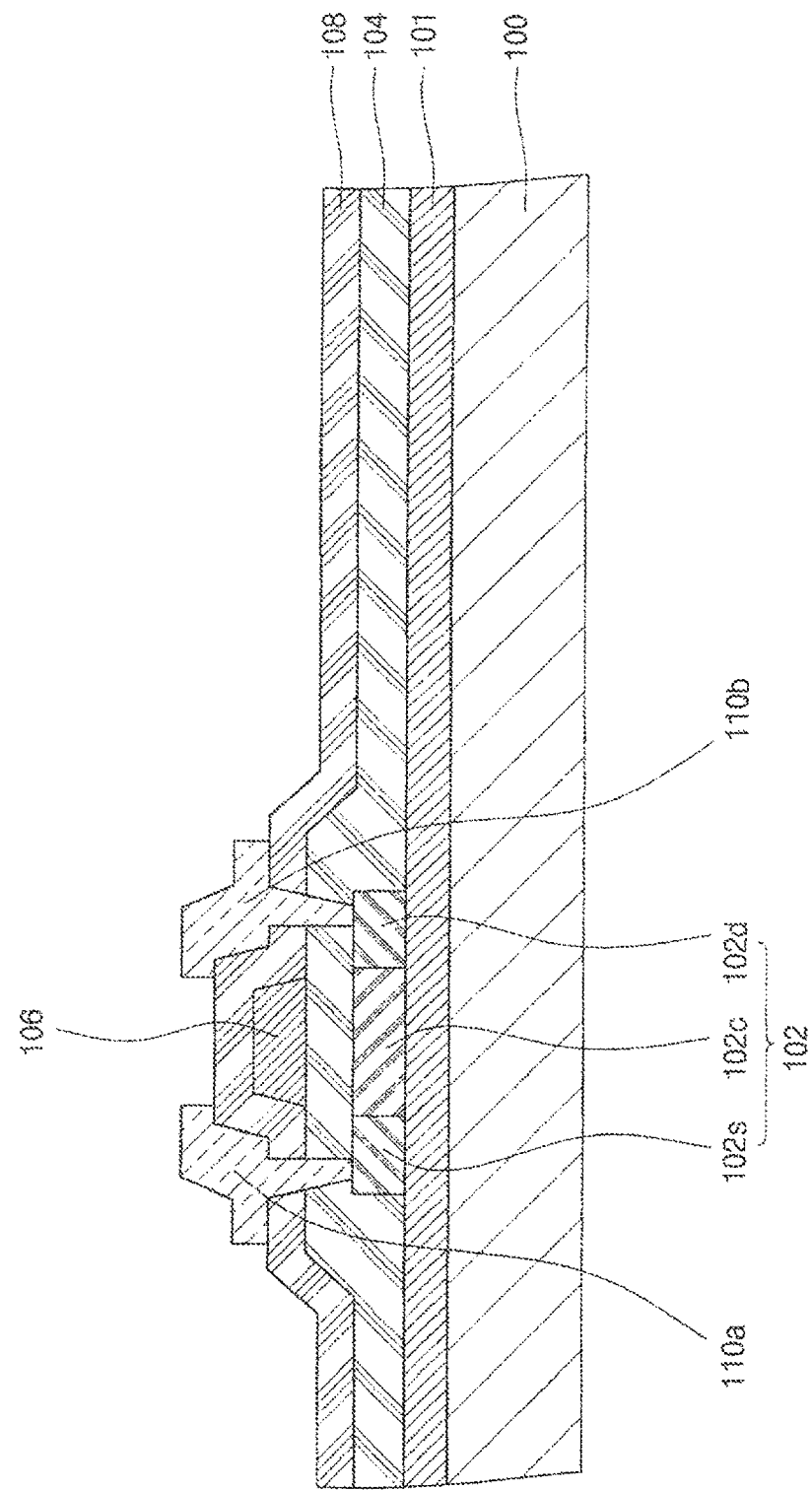

Non-limiting example embodiments of the present invention will be described more fully hereinafter with reference to the accompanying drawings, in which the non-limiting example embodiments of the invention are shown. This invention may, however, be embodied in different forms and should not be construed as limited to the embodiments set forth herein. Rather, these non-limiting embodiments are provided so that this disclosure will be thorough and complete, and will fully convey the scope of the invention to those skilled in the art. In the drawings, the thicknesses of layers and regions may be exaggerated for clarity. Like reference numerals designate like elements throughout the specification.

FIGS. 1A to 1E are cross-sectional views illustrating an organic light emitting diode (OLED) display device according to non-limiting example embodiments of the present invention.

Referring to FIGS. 1A and 1B, a substrate 100 is provided. The exemplary material included in the substrate 100 may be glass or plastic.

Subsequently, a buffer layer 101 is formed on the substrate 100. The buffer layer 101 functions to facilitate crystallization of a polycrystalline silicon layer to be formed in the following process by preventing diffusion of moisture or impurities generated from the underlying substrate 100 and/or controlling a heat transfer rate during crystallization.

Then, an amorphous silicon layer (not illustrated) is formed on the buffer layer 101. Here, the amorphous silicon layer may be formed by chemical vapor deposition or physical vapor deposition. While or after forming the amorphous silicon layer, the amorphous silicon layer may be dehydrogenated to reduce the concentration of hydrogen.

A semiconductor layer 102 is formed by crystallizing the amorphous silicon layer into a polycrystalline silicon layer. Here, the semiconductor layer 102 is formed by crystallizing the amorphous silicon layer using a solid phase crystallization (SPC) process, a sequential lateral solidification (SLS) process, a metal induced crystallization (MIC) process, a metal induced lateral crystallization (MILC) process, a super grain silicon (SGS) process, a rapid thermal annealing (RTA) process, or an excimer laser annealing (ELA) process, and then patterning the crystallized layer.

After that, a gate insulating layer 104 is formed on the substrate 100 having the semiconductor layer 102, and the gate insulating layer may be formed using silicon oxide, silicon nitride or a combination thereof. In addition, the gate insulating layer may be a single- or multi-layered structure.

A gate electrode 106 is then formed on the gate insulating layer 104. The gate electrode 106 is formed on a portion of the gate insulating layer 104 corresponding to the semiconductor layer 102 by forming a metal layer, and etching the metal layer for the gate electrode by photolithography. The metal layer for a gate electrode (not illustrated) may be a single layer of aluminum (Al) or an aluminum-neodymium (Al—Nd) or a multilayer including an aluminum alloy stacked on a chromium (Cr) or molybdenum (Mo) alloy.

Referring to FIG. 1B, source and drain regions $102s$ and $102d$ are formed by injecting an impurity having an opposite conductivity type to the impurity injected into the silicon layer into the source and drain regions $102s$ and $102d$ of the semiconductor layer 102, using the gate electrode 106 as a mask. Alternatively, the source and drain regions may be formed by forming a photoresist pattern exposing the regions to be source and drain regions and then injecting an impurity. When the gate electrode 106 is formed at a location corresponding to the semiconductor layer 102, channel, source and drain regions $102c$, $102s$ and $102d$ may be defined in the semiconductor layer 102 as descried in the following process.

Afterward, an interlayer insulating layer 108 is formed on the entire surface of the substrate 100. The interlayer insulating layer 108 may be a silicon nitride layer, a silicon oxide layer or a multilayer thereof.

Subsequently, source and drain electrodes $110a$ and $110b$ connected to the source and drain regions $102s$ and $102d$ through contact holes (not illustrated) exposing the source and drain regions $102s$ and $102d$ of the semiconductor layer 102 are formed by etching the interlayer insulating layer 108 and the gate insulating layer 104. The source and drain electrodes $110a$ and $110b$ may be formed using material such as Mo, Cr, tungsten (W), Al—Nd, titanium (Ti), MoW and Al. These may be used alone or in a combination thereof.

Figure 1C:
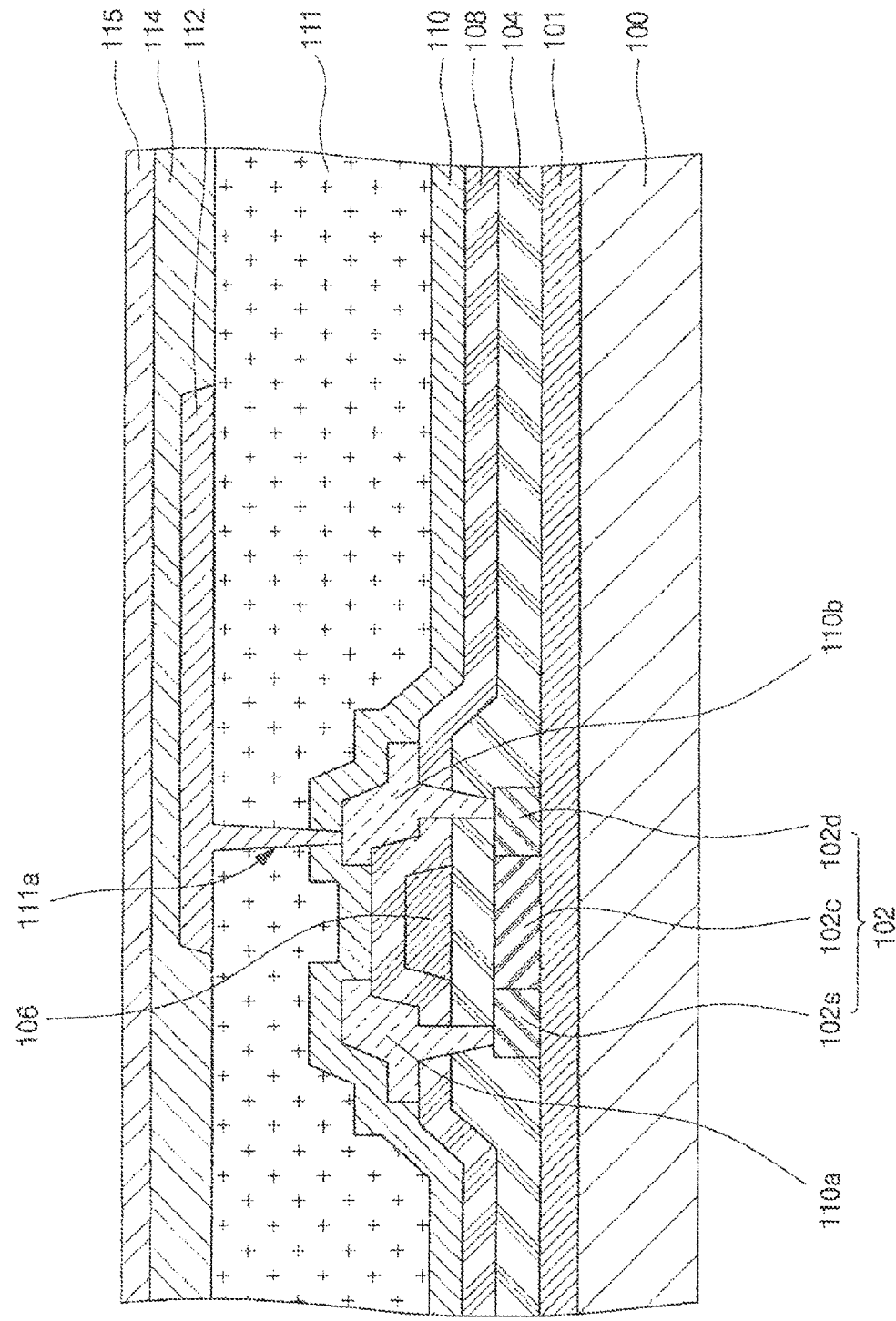

Referring to FIG. 1C, a passivation layer 110 is formed on the entire surface of the substrate including the source and drain electrodes $110a$ and $110b$, and a planarization layer 111 is formed on the passivation layer 110. A first electrode 112 connected to one of the source and drain electrodes $110a$ and $110b$ through a via hole $111a$ formed in the planarization layer 111 is then formed. The first electrode 112 may be a transparent or reflective electrode. When the first electrode 112 is used as a transparent electrode, the first electrode 112 may include ITO, IZO, ZnO or $In_2O_3$. These may be used alone or in a combination thereof. In contrary, when the first electrode 112 is used as a reflective electrode, the first electrode 112 may be formed in a multilayered structure including a first layer formed including Ag, Mg, Al, Pt, Pd, Au, Ni, Nd, Ir, Cr or a combination thereof, and a second layer including ITO, IZO, ZnO or $In_2O_3$ on the first layer.

After that, a pixel defining layer 114 defining a pixel is formed on the first electrode 112. Here, the pixel defining layer 114 is formed using a photoresist material, and formed to have a thickness of about 1,000 Å to 1 μm for proper function.

A polymer layer 115 is formed on the pixel defining layer 114.

Here, the polymer layer 115 may be formed using a fluorine-based polymer selected from materials represented by Formulae 1 to 3. Alternatively, the polymer layer 115 may be formed using a functional material containing about 10 to 50% fluorine.

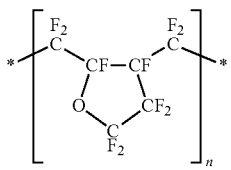

[Formula 1]

(Here, n is an integer of about 50 to 1,000.)

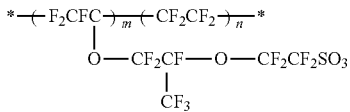

[Formula 2]

(Here, m is an integer of about 50 to 1,000, and n is an integer of about 50 to 1,000.)

[Formula 3]

(Here, n is an integer of about 50 to 1,000.)

When the polymer layer 115 is formed using the fluorine-based polymer, the polymer layer 115 may have a coating effect of a hydrophobic surface. Thus, diffusion of water, organic materials or other contaminants may be prevented. The fluorine-based polymer layer 115 may be advantageously formed to have a thickness of about 100 Å or more for the coating effect. However, when the polymer layer 115 is too thick, it is difficult to apply laser ablation to the polymer layer. Thus, the polymer layer 115 may be advantageously formed to have a thickness of about 3,000 Å or less, and the polymer layer may be formed by deposition or spin coating.

Referring to FIG. 1D, pulse-type excimer laser is applied to a part of the polymer layer 115 to partially remove the pixel defining layer 114 and the polymer layer 115 by laser ablation, thereby exposing a part of the first electrode 112.

When the laser ablation is applied to the polymer layer 115 by radiating the excimer laser, the laser is transmitted through the polymer layer 115, and is absorbed in the pixel defining layer 114 formed using a photoresist at the laser-irradiated portion, thereby lifting off the photoresist due to thermal diffusion. Thus, the polymer layer 115 and the pixel defining layer 114 are patterned. Here, when the laser is irradiated at an intensity of about 300 mW/cm$^2$ or more, the photoresist becomes hydrophilic, and thus is easily lifted off.

The surface of the first electrode 112 opened by patterning is hydrophilic, so that the first electrode 112 may have a better surface property when an organic layer is formed.

Figure 1E:
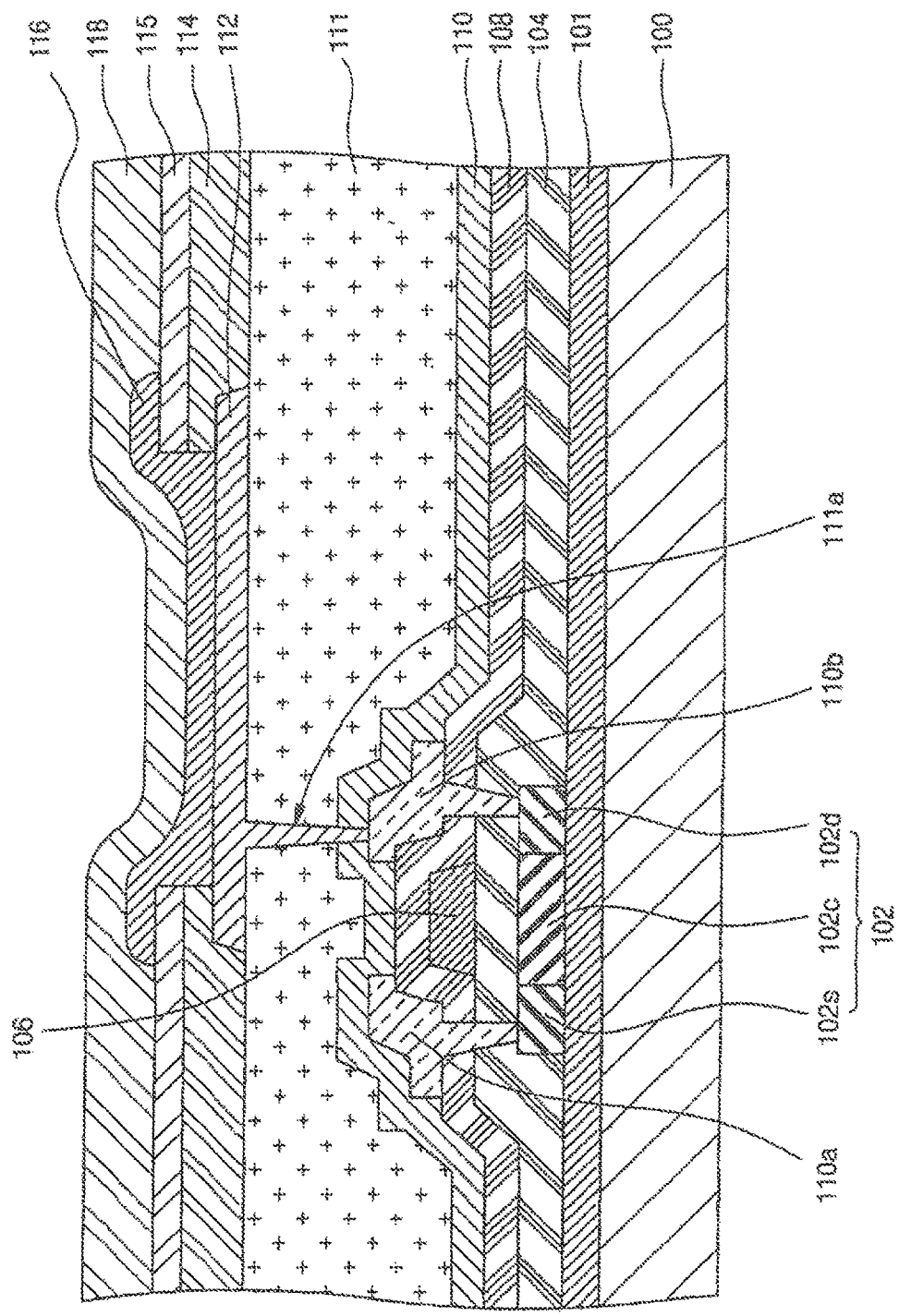

Referring to FIG. 1E, an organic layer 116 including an organic emission layer is formed on the opened first electrode 112. The organic layer 116 may be formed by deposition or laser induced thermal imaging (LITI).

A second electrode 118 is then formed on the entire surface of the substrate 100.

Here, the second electrode 118 may also be a transparent or reflective electrode. When the second electrode 118 is a transparent electrode, the second electrode 118 may include a first layer formed using Li, Ca, LiF/Ca, LiF/Al, Al, Mg or a combination thereof and a second layer formed using ITO, IZO, ZnO or In$_2$O$_3$ on the first layer. Here, the second layer may be an auxiliary electrode or a bus electrode line.

Alternatively, when the second electrode 118 is a reflective electrode, the second electrode 118 may be formed using Li, Ca, LiF/Ca, LiF/Al, Al, Mg or a combination thereof on the entire surface of the substrate.

The organic layer 116 located between the first and second electrodes 112 and 118 may be formed using a small molecule or polymer organic material.

The thin film transistors may be flexibly manufactured, and thus the OLED display device including the thin film transistor may have flexibility.

According to an OLED display device and a method of manufacturing the same of the present invention, a fluorine-based polymer layer is formed on a pixel defining layer to prevent diffusion of contaminants such as organic materials and water, and thus defects generated in fabrication of the OLED display device may be reduced, a process may be simplified due to an easy patterning technique and production yield may be effectively improved.

Although the present invention has been described with reference to non-limiting example embodiments thereof, it will be understood by those skilled in the art that a variety of modifications and variations may be made to the present invention without departing from the spirit or scope of the present invention defined in the appended claims, and their equivalents.

What is claimed is:

1. A method of manufacturing an organic light emitting diode (OLED) display device, comprising:
   providing a substrate;
   forming a first electrode on the substrate;
   forming a pixel defining layer on substrate to entirely cover the first electrode;
   forming a fluorine-based polymer layer on the pixel defining layer, the fluorine-based polymer layer being composed of a hydrophobic material;
   forming an opening in the pixel defining layer and forming an opening in the fluorine-based polymer layer to expose a part of the first electrode, the opening of the fluorine-based polymer layer interconnecting to the opening of the pixel-defining layer to expose a part of the first electrode, the first electrode covering the opening of the pixel-defining layer, a surface of the first electrode exposed through the opening of the pixel-defining layer being hydrophilic;
   forming an organic layer on the exposed part of the first electrode, the opening of the fluorine-based polymer layer filled with the organic layer, the organic layer being internally contiguous, the organic layer contacting the fluorine-based polymer layer; and
   forming a second electrode on the organic layer and the fluorine-based polymer layer, the organic layer forming a contact lip, the contact lip lying between the fluorine-based polymer layer and the second electrode.

2. The method of claim 1, the formation of the opening in the pixel defining layer and the fluorine-based polymer layer comprising patterning the pixel defining layer and the fluorine-based polymer layer by laser ablation.

3. The method of claim 2, the laser being irradiated at an intensity of about 300 mW/cm$^2$ or more.

4. The method of claim 1, the pixel defining layer being formed using a photoresist material.

5. The method of claim 1, the fluorine-based polymer layer being formed using at least one of the compounds represented by Formulae 1 to 3:

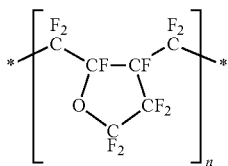

n being an integer of from about 50 to about 1,000;

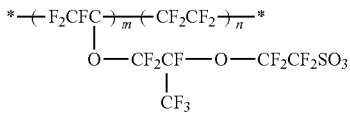

m being an integer of from about 50 to about 1,000, and n being an integer of from about 50 to about 1,000; and

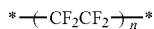

n being an integer of from about 50 to about 1,000.

6. The method of claim 5, the fluorine-based polymer layer comprising a compound represented by Formula 1.

7. The method of claim 5, the fluorine-based polymer layer comprising a compound represented by Formula 2.

8. The method of claim 5, the fluorine-based polymer layer comprising a compound represented by Formula 3.

9. The method of claim 1, the fluorine-based polymer layer being formed to have a thickness of from about 100 Å to about 3,000 Å.

* * * * *